(12) United States Patent
Tanaka (10) Patent No.: US 10,291,020 B2
(45) Date of Patent: May 14, 2019

(54) OVERVOLTAGE PROTECTION DEVICE

(71) Applicant: ALPINE ELECTRONICS, INC., Shinagawa-ku, Tokyo (JP)

(72) Inventor: Norihiko Tanaka, Iwaki (JP)

(73) Assignee: ALPINE ELECTRONICS, INC., Tokyo (JP)

( * ) Notice: Subject to any disclaimer, the term of this patent is extended or adjusted under 35 U.S.C. 154(b) by 291 days.

(21) Appl. No.: 15/350,736

(22) Filed: Nov. 14, 2016

(65) Prior Publication Data
US 2017/0187182 A1 Jun. 29, 2017

(30) Foreign Application Priority Data
Dec. 24, 2015 (JP) .................. 2015-251307

(51) Int. Cl.
*H02H 1/00* (2006.01)
*H02H 9/04* (2006.01)
*H01L 27/06* (2006.01)
*H01L 29/866* (2006.01)
*H03K 19/003* (2006.01)

(52) U.S. Cl.
CPC ......... *H02H 9/044* (2013.01); *H01L 27/0647* (2013.01); *H02H 1/0007* (2013.01); *H02H 1/0061* (2013.01); *H03K 19/00315* (2013.01); *H01L 29/866* (2013.01)

(58) Field of Classification Search
CPC . H01L 27/0647; H01L 29/866; H02H 1/0007; H02H 1/0061; H02H 9/044; H03K 19/00315
USPC .......................................... 361/56
See application file for complete search history.

(56) References Cited

U.S. PATENT DOCUMENTS

| 5,574,395 | A | 11/1996 | Kusakabe |
| 2007/0284667 | A1 | 12/2007 | Nagai |

FOREIGN PATENT DOCUMENTS

| JP | S52 128081 | 10/1977 |
| JP | S63316475 | 12/1988 |
| JP | 03-085016 | 4/1991 |
| JP | H0521714 | 1/1993 |
| JP | H1174468 | 3/1999 |
| JP | 2009-071373 | 4/2009 |

OTHER PUBLICATIONS

Partial European Search Report for 16206339.0 dated May 24, 2017, 11 pgs.
Office Action for Japanese Patent Application 2015-252307 dated Mar. 26, 2019, 13 pages including English translation.

*Primary Examiner* — Kevin J Comber
(74) *Attorney, Agent, or Firm* — Brinks Gilson & Lione (57) ABSTRACT

An overvoltage protection device includes a resistor that is connected in series between an internal signal line connected to a communication terminal of a processor and a communication line, a diode of which a cathode is connected to the internal signal line and an anode is connected to a ground, and a PNP transistor of which a base is connected to a power supply terminal, an emitter is connected to the internal signal line, and a collector is connected to the ground. When a base-emitter voltage (a junction saturation voltage) of the transistor in operation is defined as VBE and a power source is turned on (a voltage V1) by the operation of the transistor, a voltage of the internal signal line is limited to the source voltage V1+VBE. When the power source is turned off (a voltage 0 V), the voltage of the internal signal line is limited to the source voltage 0 V+VBE.

8 Claims, 7 Drawing Sheets

PRIOR ART

FIG. 7B

PRIOR ART

OVERVOLTAGE PROTECTION DEVICE

RELATED APPLICATION

The present application claims priority to Japanese Patent Application Number 2015-251307, filed Dec. 24, 2015, the entirety of which is hereby incorporated by reference.

BACKGROUND

1. Field of the Invention

The present invention relates to a technique of protecting a device for transmitting a signal using a signal line from an overvoltage of the signal line.

2. Description of the Related Art

Figure 7A:
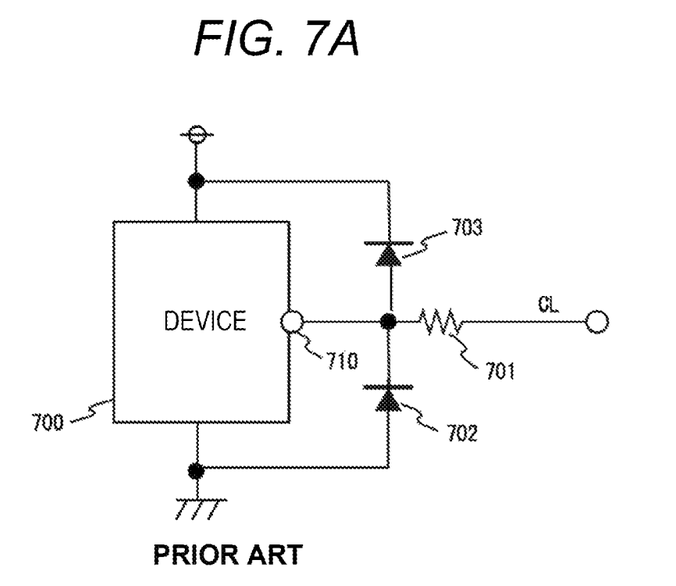
FIGS. 7A and 7B are diagrams illustrating a conventional overvoltage protection technique.

As a technique of protecting a device for transmitting a signal using a signal line from an overvoltage of the signal line, a technique of connecting a signal line CL to a signal-transmission terminal 710 of a device 700 via a resistor 701, providing a diode 702 of which the cathode is connected to the terminal 710 of the device 700 and the anode is connected to the ground and a diode 703 of which the anode is connected to the terminal 710 of the device 700 and the cathode is connected to a power source, suppressing a current flowing in the terminal 710 using the resistor 701, suppressing a decrease of a voltage applied to the terminal 710 to a potential lower than the ground potential using the diode 702, and suppressing an increase of the voltage applied to the terminal 710 to a potential higher than the potential of the power source using the diode 703 is known as illustrated in FIG. 7A (for example, refer to JP 3-85016 A).

Figure 7B:
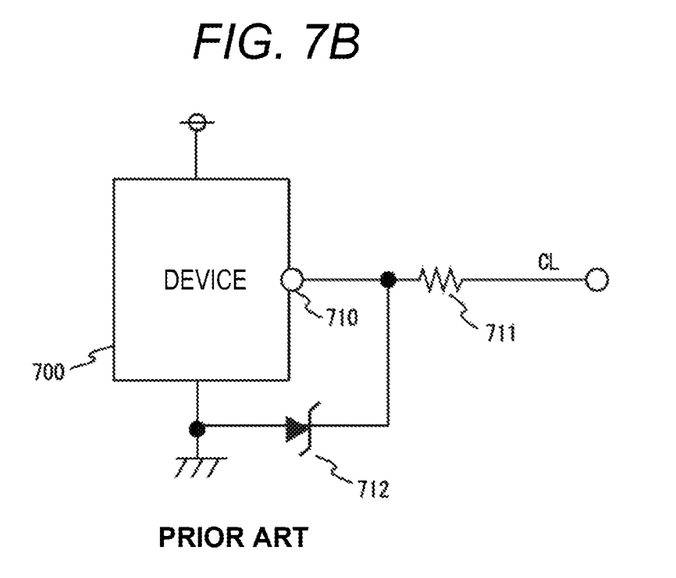

As a technique of protecting a device 700 for transmitting a signal using a signal line from an overvoltage of the signal line, a technique of providing a Zener diode 712 of which the cathode is connected to a signal-transmission terminal 710 of the device 700 and the anode is connected to the ground, suppressing a current flowing in the terminal 710 using a resistor 711, and suppressing an increase of a voltage applied to the terminal 710 to a potential higher than a Zener voltage of the Zener diode 712 using a Zener diode 712 is known as illustrated in FIG. 7B (for example, JP 2009-71373 A).

According to the technique illustrated in FIG. 7A, when an overvoltage is generated in the signal line CL and a current flowing into the power source via the diode 703 is larger than current consumption in the device 700, the potential of the power source of the device 700 may be higher than a rated voltage of the device 700 and thus the device 700 may be destroyed.

According to the technique illustrated in FIG. 7B, when the power source of the device 700 is turned off and an overvoltage is generated in the signal line CL, the voltage applied to the terminal 710 may be higher than the absolute rated voltage and thus the device 700 may be destroyed.

That is, for example, when it is assumed that the absolute rated voltage of the terminal 710 is in a range between the ground potential −0.5 V and the power source potential +0.5 V, the power source voltage when the power source is turned on is 5 V, and the Zener voltage of the Zener diode 712 is 5 V, the absolute rated voltage in a state in which the power source is turned on is in a range between −0.5 V and 5.5 V (5 V+0.5 V). When the power source is turned on, the voltage applied to the terminal 710 is limited to the Zener voltage 5 V or less and thus the voltage applied to the terminal 710 is in the range of the absolute rated voltage. On the other hand, when the power source of the device 700 is turned off and the potential of the power source is 0 V, the absolute rated voltage is in a range between −0.5 V and +0.5 V. Accordingly, even when the voltage applied to the terminal 710 is limited to the Zener voltage 5 V or less, the voltage applied to the terminal 710 cannot be limited to the range of the absolute rated voltage.

In addition, there is a problem in that a great individual difference is present in the Zener voltage of a general Zener diode.

SUMMARY

Therefore, an object of the present invention is to protect a device for transmitting a signal using a signal line from an overvoltage of the signal line regardless of an ON/OFF state of a power source of the device.

In order to achieve the above described object, one embodiment of the present invention is an overvoltage protection device that protects a device for transmitting a signal using a signal line from an overvoltage, including a switch configured to be turned on to connect a signal terminal of the device to a ground of the device when a voltage of the signal terminal as a terminal of the device inputting or outputting the signal transmitted using the signal line is higher by a predetermined level than a voltage of a power supply terminal as a terminal of the device supplied with a source voltage of the device.

According to the overvoltage protection device, when the voltage of the signal terminal of the device is higher by a predetermined level than the voltage of the power supply terminal of the device, the power supply terminal and the ground are connected by the switch. Accordingly, the voltage of the signal terminal is limited not to be equal to or higher than a voltage obtained by adding the predetermined level to the source voltage when the source voltage is supplied to the power supply terminal of the device, and is limited not to be equal to or higher than a voltage of the predetermined level when the source voltage is not supplied to the power supply terminal of the device. That is, the voltage of the signal terminal is always limited to equal to or lower than the voltage obtained by adding the predetermined level to the voltage of the power supply terminal. Accordingly, by appropriately setting the predetermined level, it is possible to prevent the voltage of the signal terminal from departing from a rated voltage range of the device. In addition, since the signal terminal and the power supply terminal are not directly connected to each other, an increase in the voltage of the power supply terminal is also suppressed.

In order to achieve the above-mentioned object, according to one embodiment of the present invention, there is provided an overvoltage protection device that protects a device for transmitting a signal using a signal line from an overvoltage, including: a PNP transistor of which an emitter is connected to the signal terminal as a terminal of the device inputting or outputting the signal transmitted using the signal line, a base is connected to the power supply terminal as a terminal of the device supplied with a source voltage of the device, and a collector is connected to the ground of the device.

Here, it is preferable that the overvoltage protection device further include a diode of which a cathode is connected to the emitter of the transistor and an anode is connected to the ground of the device. In this case, it is also preferable that the overvoltage protection device further include a resistor of which a first terminal is connected to the cathode of the diode and a second terminal is connected to the signal line.

According to the overvoltage protection device, when the voltage of the signal terminal of the device is higher by the junction saturation voltage (VBE) of the transistor or more than the voltage of the power supply terminal of the device, the power supply terminal and the ground are connected by the transistor. Accordingly, the voltage of the signal terminal is limited not to be equal to or higher than a voltage obtained by adding the junction saturation voltage (VBE) of the transistor to the source voltage when the power supply terminal of the device is supplied with the source voltage, and is limited not to be equal to or higher than the junction saturation voltage (VBE) of the transistor when the power supply terminal of the device is not supplied with the source voltage. That is, the voltage of the signal terminal is always limited to be equal to or less than the voltage obtained by adding the junction saturation voltage (VBE) of the transistor to the voltage of the power supply terminal. Accordingly, it is possible to prevent the voltage of the signal terminal from departing from the rated voltage range of the device by using a transistor with an appropriate junction saturation voltage (VBE). Since the signal terminal and the power supply terminal are not directly connected, an increase in the voltage of the power supply terminal is also suppressed.

In order to achieve the above-mentioned object, according to an embodiment of the present invention, there is provided an overvoltage protection device that protects a device for transmitting a signal using a signal line from an overvoltage, including: a first switch of which switching between an ON state and an OFF state is controlled by the device; a resistor; and a second switch. Here, the first switch connects a power supply terminal as a terminal of the device supplied with a source voltage of the device and a first terminal of the resistor in the ON state, a second terminal of the resistor is connected to a ground of the device, and the second switch is turned on to connect the signal terminal of the device to the ground of the device when a voltage of the signal terminal as a terminal of the device inputting and outputting the signal transmitted using the signal line is higher by a predetermined level than the voltage of the first terminal of the resistor.

Here, in the overvoltage protection device, it is preferable that the second switch be a Darlington circuit.

According to the overvoltage protection device, the voltage of the signal terminal is limited to be equal to or lower than a voltage obtained by adding the predetermined level to the source voltage when the first switch is in the ON state, and the voltage of the signal terminal is limited to be equal to or lower than the voltage of the predetermined level when the first switch is in the OFF state. When the first switch is in the OFF state, supply of power from the power source to a voltage protection circuit is intercepted.

Accordingly, when the first switch is switched to the ON state in a period in which the device performs a normal operation accompanied with a signal transmitting operation, the voltage of the signal terminal can be limited to be equal to or lower than a voltage obtained by adding the predetermined level to the source voltage. By configuring the overvoltage protection device such that the first switch is in the OFF state in a period in which the power supply terminal of the device is not supplied with the source voltage, the voltage of the signal terminal can be limited not to be equal to or higher than the voltage of the predetermined level in the period in which the power supply terminal of the device is not supplied with the source voltage. Accordingly, since the voltage of the signal terminal can always be limited to be equal to or lower than the voltage obtained by adding the predetermined level to the voltage of the power supply terminal in these periods, it is possible to prevent the voltage of the signal terminal from departing from the rated voltage range of the device by appropriately setting the predetermined level.

When the device is in a standby state in which the signal transmitting operation is not performed, it is possible to prevent the voltage of the signal terminal from departing from the rated voltage range of the device and to suppress power consumption of the power source in the overvoltage protection device, by setting the first switch to the OFF state to limit the voltage of the signal terminal not to be equal to or higher than the voltage of the predetermined level.

In order to achieve the above-mentioned object, according to an embodiment of the present invention, there is provided an overvoltage protection device that protects a device for transmitting a signal using a signal line from an overvoltage, including: a first transistor; a second transistor; a third transistor; a first diode; a first resistor; and a second resistor. Here, the first transistor is a PNP transistor of which an emitter is connected to a power supply terminal as a terminal of the device supplied with a source voltage of the device, a base is connected to a control signal output terminal of the overvoltage protection device of the device, and a collector is connected to an anode of the first diode. A cathode of the first diode is connected to a first terminal of the first resistor. A second terminal of the first resistor is connected to the ground of the device. The second transistor is a PNP transistor of which an emitter is connected to a signal terminal as a terminal of the device inputting or outputting the signal transmitted using the signal line, a base is connected to the first terminal of the first resistor, and a collector is connected to a first terminal of the second resistor. A second terminal of the second resistor is connected to the ground of the device. The third transistor is an NPN transistor of which a collector is connected to the signal terminal of the device, a base is connected to the first terminal of the second resistor, and an emitter is connected to the ground of the device.

In the overvoltage protection device, it is preferable that a forward voltage of the first diode be equal to a junction saturation voltage (VBE) of the second transistor.

It is preferable that the overvoltage protection device further include a second diode of which a cathode is connected to the collector of the third transistor and an anode is connected to the ground of the device. In this case, it is also preferable that the overvoltage protection device further include a resistor of which a first terminal is connected to the cathode of the second diode and a second terminal is connected to the signal line.

According to the above-mentioned overvoltage protection device, the voltage of the signal terminal is limited to be equal to or lower than a voltage obtained by adding the junction saturation voltage (VBE) of the second transistor to the source voltage when the first transistor is turned on by outputting a control signal from the device, and the voltage of the signal terminal is limited to be equal to or lower than the junction saturation voltage (VBE) of the second transistor when the first transistor is turned off by outputting a control signal from the device. When the first transistor is turned off, supply of power from the power source to a voltage protection circuit is intercepted.

Therefore, when the first transistor is switched to the ON state in a period in which the device performs a normal operation accompanied with a signal transmitting operation, the voltage of the signal terminal can be limited to be equal to or lower than the voltage obtained by adding the junction saturation voltage (VBE) of the second transistor to the source voltage. In addition, since the first transistor is turned off in a period in which the power supply terminal of the device is not supplied with the source voltage, the voltage of the signal terminal is limited not to be equal to or higher than the voltage of the junction saturation voltage (VBE) of the second transistor.

Accordingly, since the voltage of the signal terminal can be limited to be equal to or lower than the voltage obtained by adding the junction saturation voltage (VBE) of the second transistor to the voltage of the power supply terminal in these periods, it is possible to prevent the voltage of the signal terminal from departing from the rated voltage range of the device by using a second transistor having an appropriate junction saturation voltage (VBE).

When the device is in a standby state in which the signal transmitting operation is not performed, it is possible to prevent the voltage of the signal terminal from departing from the rated voltage range of the device and to suppress power consumption of the power source in the overvoltage protection device, by setting the first transistor to the OFF state to limit the voltage of the signal terminal not to be equal to or higher than the junction saturation voltage (VBE) of the second transistor.

As described above, according to embodiments of the present invention, it is possible to protect a device for transmitting a signal using a signal line from an overvoltage of the signal line regardless of an ON/OFF state of a power source of the device.

DETAILED DESCRIPTION OF THE PREFERRED EMBODIMENTS

Hereinafter, embodiments of the present invention will be described.

First, a first embodiment will be described below.

Figure 1:
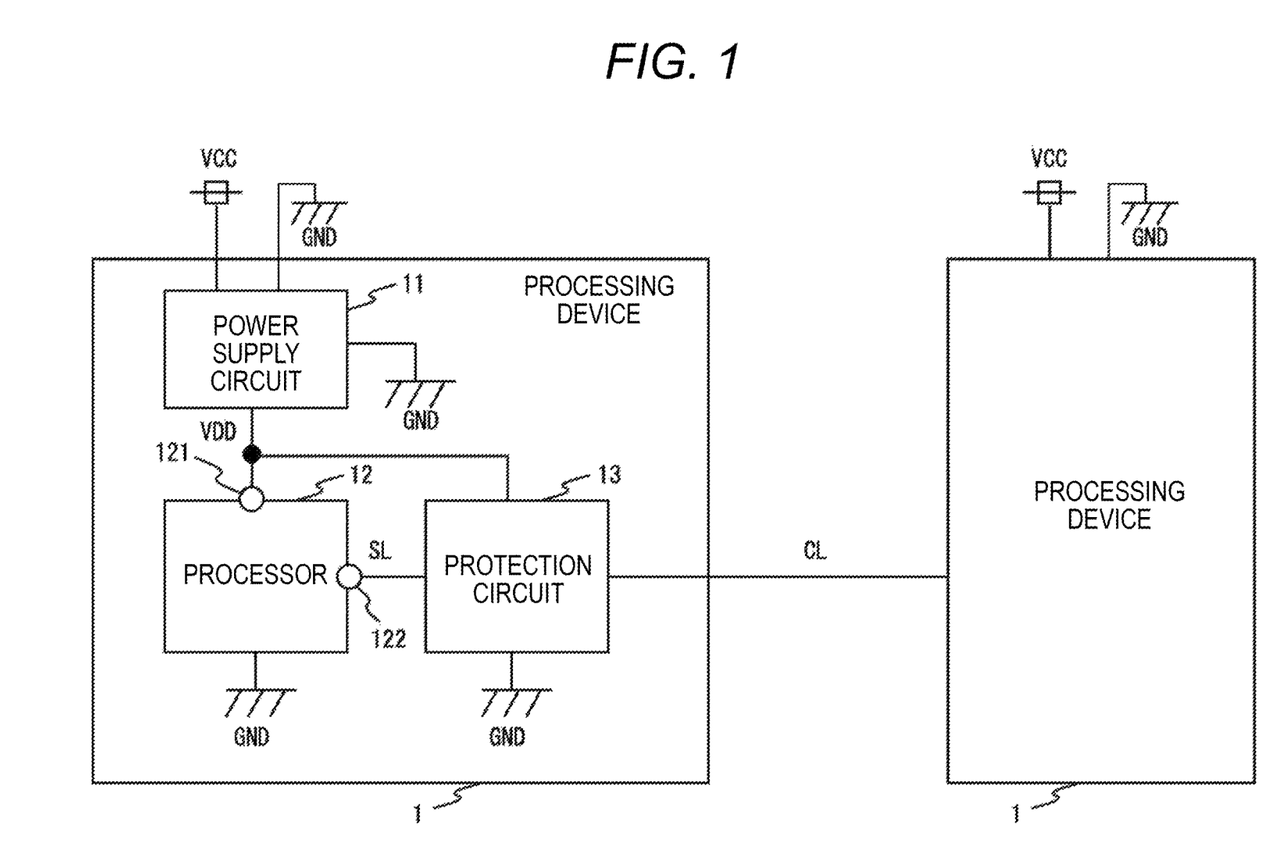
FIG. 1 is a block diagram illustrating a configuration of a processing device according to a first embodiment of the present invention.

FIG. 1 illustrates a configuration of a processing device according to the first embodiment. The processing device is, for example, an electronic device which is mounted in an automobile and is a device configured to transmit a signal or data using a signal line SL to another processing device. As illustrated in the drawing, the processing device 1 includes a power supply circuit 11, a processor 12, and a protection circuit 13.

The power supply circuit 11 generates an internal source voltage VDD from an external source voltage VCC and supplies the generated internal source voltage to the units of the processing device 1. The external source voltage is, for example, a battery of the automobile.

The processor 12 is a device configured to perform a data process such as a microcomputer, operates with the source voltage VDD supplied to a power supply terminal 121, and transmits a signal from a communication terminal 122 or receives a signal via the communication terminal 122.

The protection circuit 13 is disposed between the communication line CL used for communication with another processing device 1 and the internal signal line SL connected to the communication terminal 122 of the processor 12, connects the communication line CL and the internal signal line SL, and protects the processor 12 from an overvoltage of the communication line CL.

Figure 2:
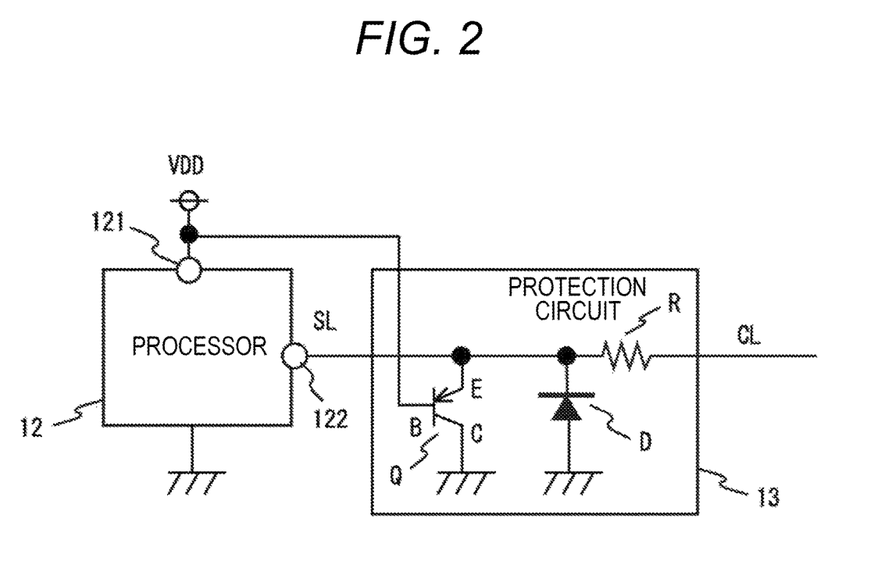
FIG. 2 is a circuit diagram illustrating a configuration of a protection circuit according to the first embodiment of the present invention.

A configuration of the protection circuit 13 is illustrated in FIG. 2. As illustrated in the drawing, the protection circuit 13 includes a current-limiting resistor R connected in series between the internal signal line SL connected to the communication terminal 122 of the processor 12 and the communication line CL, a diode D of which the cathode is connected to the internal signal line SL and the anode is connected to the ground GND, and a PNP transistor Q of which the base is connected to the power supply terminal 121 of the processor 12, the emitter is connected to the internal signal line SL, and the collector is connected to the ground GND.

Figure 3A:
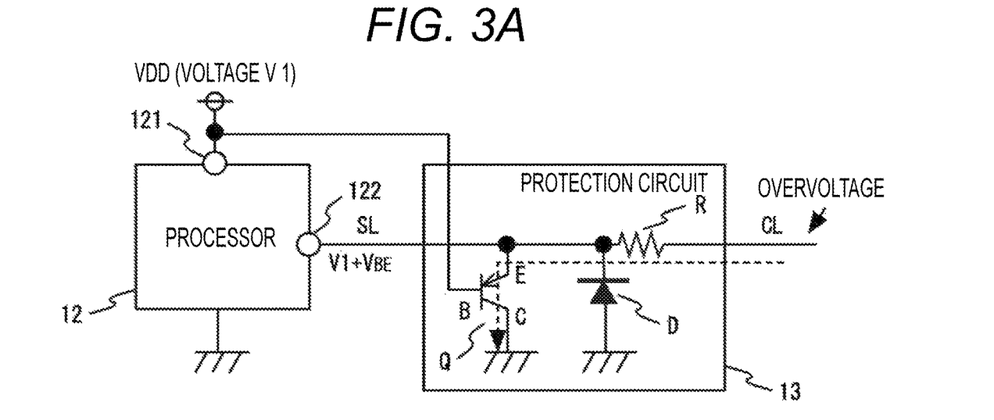
FIGS. 3A to 3C are diagrams illustrating an operation of the protection circuit according to the first embodiment of the present invention.

According to the protection circuit 13, as illustrated in FIG. 3A, when the power source VDD is in the ON state, the source voltage of V1 is supplied to the power supply terminal 121 of the processor 12, and an overvoltage is applied to the communication line CL, the voltage of the internal signal line SL increases and the potential of the emitter of the transistor Q becomes higher by the junction saturation voltage VBE of the transistor Q or more than the potential V1 of the base. The junction saturation voltage VBE is an emitter-collector voltage when a base current flows in the transistor, and is almost constant without depending on the magnitude of the base current.

When the potential of the emitter is higher by the junction saturation voltage VBE of the transistor Q than the potential V1 of the base, a base current IB flows and a current flows from the internal signal line SL to the ground GND via the emitter and the collector of the transistor Q. At this time, the potential of the internal signal line SL is clamped to V1+VBE.

Accordingly, the voltage applied to the communication line CL when the power source VDD is in the ON state is limited not to be higher than V1+VBE. Therefore, it is possible to prevent an overvoltage out of the rated voltage range from being applied to the processor 12 by using a transistor having an appropriate value of VBE as the transistor Q.

Figure 3B:
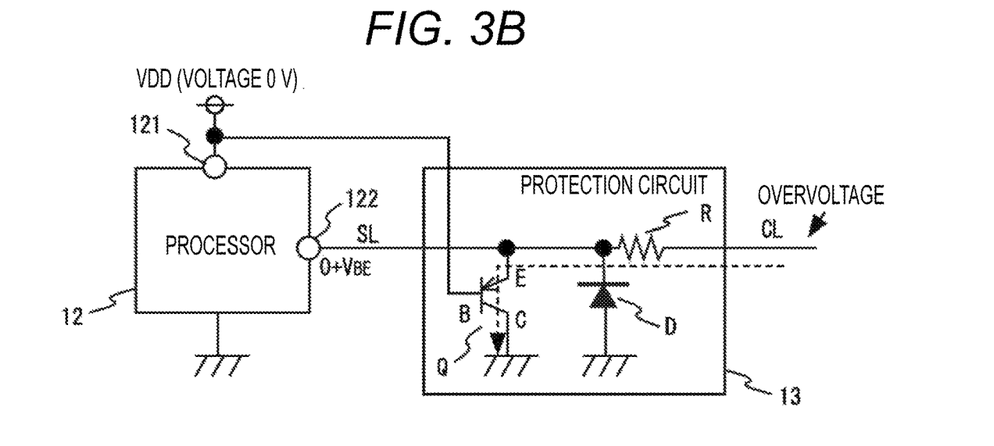

According to the protection circuit 13, as illustrated in FIG. 3B, when an overvoltage is applied to the communication line CL in a state in which the power source VDD is turned off, that is, in a state in which the source voltage VDD supplied to the power supply terminal 121 of the processor 12 is 0 V, the voltage of the internal signal line SL increases, and the potential of the emitter of the transistor Q is equal to or higher by the junction saturation voltage VBE of the transistor Q than 0 V, the base current IB flows and a current flows from the internal signal line SL to the ground GND via the emitter and the collector of the transistor Q. At this time, the potential of the internal signal line SL is clamped to 0 V+VBE.

Accordingly, the voltage applied to the communication line CL when the power source VDD is in the OFF state is limited not to be higher than VBE. Therefore, by using a transistor having an appropriate value of VBE as the transistor Q, it is possible to prevent an overvoltage out of the rated voltage range from being applied to the processor 12 even when the power source VDD is turned off.

Figure 3C:
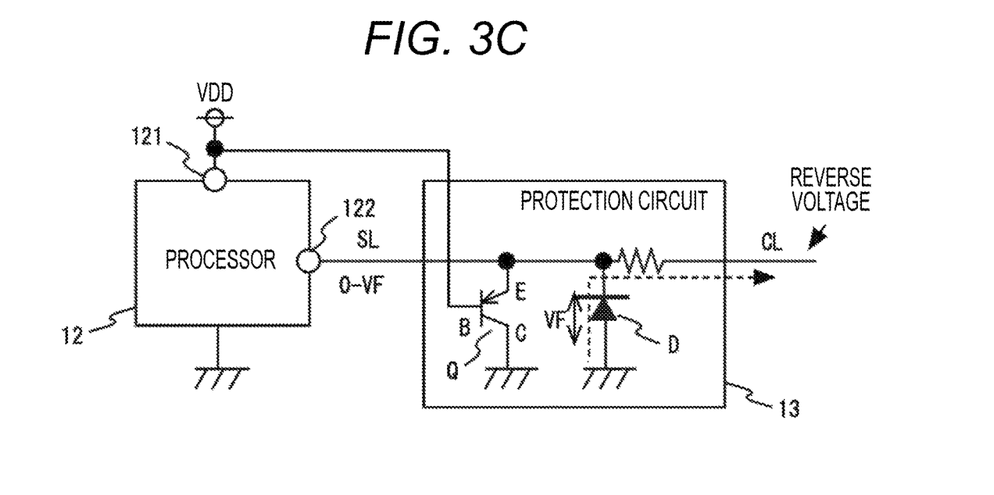

According to the protection circuit 13, as illustrated in FIG. 3C, when a voltage lower than the ground GND is applied to the communication line CL, the internal signal line SL is connected to the ground GND via the diode D and the potential of the internal signal line SL is maintained at a potential obtained by subtracting a forward voltage VF of the diode D from the potential of the ground GND.

The first embodiment of the present invention has been described above. Below, a second embodiment of the present invention will be described.

Figure 4:
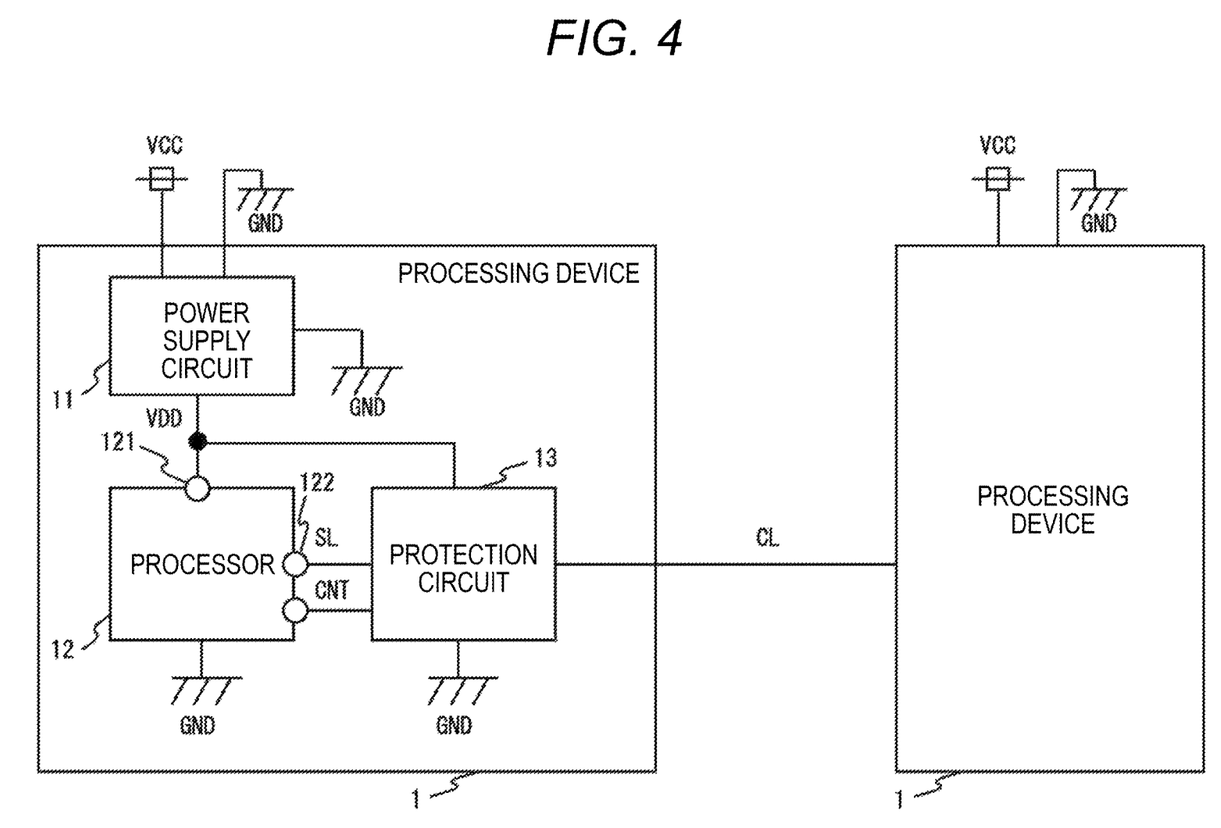
FIG. 4 is a block diagram illustrating a configuration of a processing device according to a second embodiment of the present invention.

FIG. 4 illustrates a configuration of a processing device 1 according to the second embodiment. As illustrated in the drawing, the configuration of the processing device 1 according to the second embodiment is the same as the configuration of the processing device 1 according to the first embodiment illustrated in FIG. 1, except that a control line CNT is connected between the processor 12 and the protection circuit 13. In the second embodiment, it is assumed that the processor 12 includes a normal operation mode in which the processing device performs a normal operation including transmission of a signal via the signal line CL and a standby mode in which the processing device operates with low power consumption as an operation mode.

Figure 5:
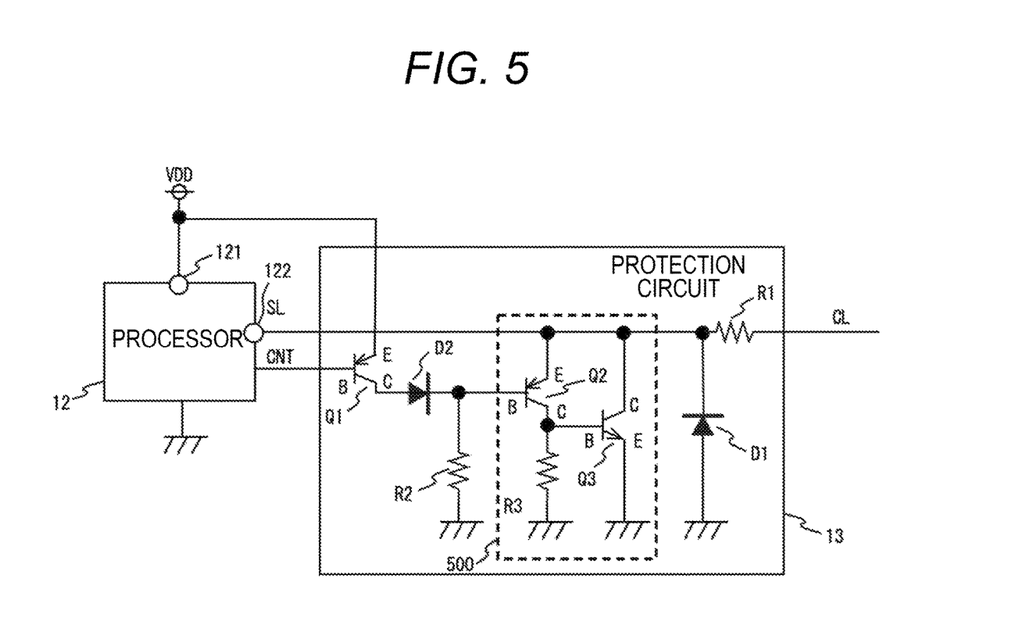
FIG. 5 is a circuit diagram illustrating a configuration of a protection circuit according to the second embodiment of the present invention.

FIG. 5 illustrates a configuration of a protection circuit 13 according to the second embodiment. As illustrated in the drawing, the protection circuit 13 includes a current-limiting first resistor R1, a second resistor R2, a third resistor R3, a first diode D1, a second diode D2, a first transistor Q1, a second transistor Q2, and a third transistor Q3.

Here, the first resistor R1 is connected in series between the internal signal line SL connected to the communication terminal 122 of the processor 12 and the communication line CL. The cathode of the first diode D1 is connected to the internal signal line SL and the anode thereof is connected to the ground GND.

The first transistor Q1 is a PNP transistor, of which the emitter is connected to a power supply terminal 121 of the processor 12, the base is connected to a control line CNT from the processor 12, and the collector is connected to the anode of the second diode D2. A first terminal of the second resistor R2 is connected to the cathode of the second diode D2, and a second terminal thereof is connected to the ground GND.

The second transistor Q2 is a PNP transistor, of which the base is connected to the cathode of the second diode D2 and the first terminal of the second resistor R2, and the emitter is connected to the internal signal line SL. A first terminal of the third resistor R3 is connected to the collector of the second transistor Q2 and the second terminal is connected to the ground GND.

The third transistor Q3 is an NPN transistor, of which the base is connected to the collector of the second transistor Q2 and the first terminal of the third resistor R3, the collector is connected to the internal signal line SL, and the emitter is connected to the ground GND. Here, the second transistor Q2, the third resistor R3, and the third transistor Q3 constitute a Darlington circuit 500

Figure 6A:
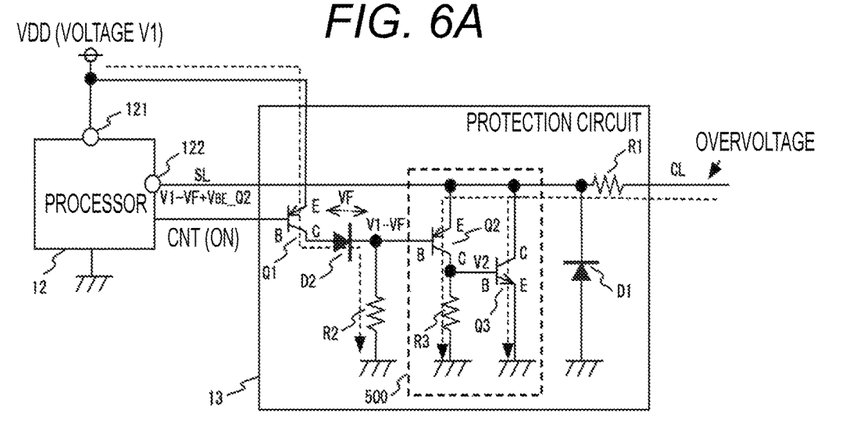
FIGS. 6A to 6C are diagrams illustrating an operation of the protection circuit according to the second embodiment of the present invention.

As illustrated in FIG. 6A, when a source voltage of a voltage V1 is supplied to the power supply terminal 121 of the processor 12 in a state in which the power source VDD is turned on and the processor 12 operates in the normal operation mode, the processor 12 applies a signal for maintaining the first transistor Q1 in the ON state to the control line CNT. Accordingly, in the protection circuit 13, a voltage of a potential V1-VF is applied to the base of the second transistor Q2 via the first transistor Q1 and the second diode D2 which are controlled to the ON state. Here, VF indicates a forward voltage of the second diode D2. In this state, when an overvoltage is applied to the communication line CL, the voltage of the internal signal line SL increases and the potential of the emitter of the second transistor Q2 is higher by the junction saturation voltage VBE of the second transistor Q2 than the potential V1-VF of the base.

When the potential of the emitter is higher by the junction saturation voltage VBE of the second transistor Q2 or more than the potential V1-VF of the base, a base current IB flows in the second transistor Q2, a current flows from the internal signal line SL to the ground GND via the emitter and the collector of the second transistor Q2 and the third resistor R3, and the potential of the first terminal of the third resistor R3 is applied to the third transistor Q3. Accordingly, the potential of the base of the third transistor Q3 is higher by the junction saturation voltage VBE of the third transistor Q3 or more than the potential of the emitter and a current flows from the internal signal line SL to the ground GND via the collector and the emitter of the third transistor Q3.

At this time, when the junction saturation voltage VBE of the second transistor Q2 is defined as VBE_Q2, the potential of the internal signal line SL is clamped to V1−VF+VBE_Q2. Accordingly, when the power source VDD is in the ON state and the operation mode of the processor 12 is in the normal operation mode, the voltage applied to the communication line CL is limited not to be higher than V1−VF+VBE_Q2.

Therefore, by using a transistor having an appropriate value of VBE as the second transistor Q2 and using a diode having an appropriate value of VF as the second diode D2, it is possible to prevent an overvoltage out of the rated voltage range from being applied to the processor 12. Particularly, by selecting a transistor to be used as the second transistor Q2 and a diode to be used as the second diode D2 such that VF of the second diode D2 and VBE of the second transistor Q2 are equal to each other, the voltage applied to the communication line CL is V1−VF+VBE_Q2+V1 and thus the voltage of the internal signal line SL is made not to be higher than the voltage V1 of the power source VDD.

According to the protection circuit 13, since the Darlington circuit 500 having high hfe (amplification factor) is used as a circuit drawing a current from the internal signal line SL to the ground GND, it is possible to suppress power consumption of the power source VDD by the protection circuit 13 when the power source VDD is in the ON state and the operation mode of the processor 12 is in the normal operation mode, to set the resistance value of the first resistor R1 to be small, and to enable high-speed communication using the communication line CL.

Figure 6B:
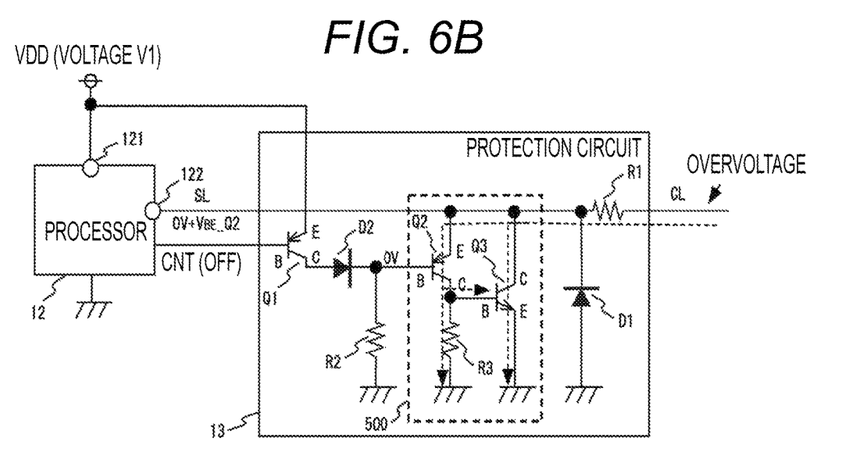

Then, as illustrated in FIG. 6B, when the power source VDD is turned on to supply the source voltage of the voltage V1 to the power supply terminal 121 of the processor 12 and the processor 12 is in the standby mode, the processor 12 sets the signal output to the control line CNT to a signal for maintaining the first transistor Q1 in the OFF state. Accordingly, in the protection circuit 13, the first transistor Q1 is switched to the OFF state and the potential of the base of the second transistor Q2 is pulled down to the ground GND by the second resistor R2 and becomes 0 V.

When an overvoltage is applied to the communication line CL in this state, the voltage of the internal signal line SL increases and the potential of the emitter of the second transistor Q2 becomes higher by the junction saturation voltage VBE of the second transistor Q2 or more than 0 V. When the potential of the emitter of the second transistor Q2 becomes higher by the junction saturation voltage VBE of the second transistor Q2 or more than 0 V, the base current IB flows in the second transistor Q2, a current flows from the internal signal line SL to the ground GND via the emitter and the collector of the second transistor Q2 and the third resistor R3, and the potential of the first terminal of the third resistor R3 is applied to the third transistor Q3.

Accordingly, the potential of the base of the third transistor Q3 becomes higher by the junction saturation voltage VBE of the third transistor Q3 or more than the potential of the emitter and a current flows from the internal signal line SL to the ground GND via the collector and the emitter of the third transistor Q3. At this time, when the junction saturation voltage VBE of the second transistor Q2 is defined as VBE_Q2, the potential of the internal signal line SL is clamped to 0 V+VBE_Q2. Accordingly, when the power source VDD is in the ON state and the operation mode of the processor 12 is the standby mode, the voltage of the internal signal line SL is limited not to be higher than VBE_Q2.

When the operation mode of the processor 12 is the standby mode, communication using the communication line CL is not performed. Since the Darlington circuit 500 having high hfe (amplification factor) is used as a circuit drawing a current to the ground GND, the base current of the second transistor Q2 flows in the second resistor R2 is small and the first terminal of the second resistor R2 is maintained substantially at 0 V.

Accordingly, by using a transistor having an appropriate value of VBE as the second transistor Q2, it is possible to prevent an overvoltage out of the rated voltage range from being applied to the processor 12 when the power source VDD is in the ON state and the operation mode of the processor 12 is the standby mode. According to the protection circuit 13, when the power source VDD is turned on to supply a source voltage of a voltage V1 and the processor 12 is in the standby mode, the first transistor Q1 can be controlled to the OFF state and thus power consumption of the power source VDD by the protection circuit 13 can be made to be 0.

The operation of the protection circuit 13 in a state in which the power source VDD is turned off, that is, in a state in which the source voltage VDD supplied to the power supply terminal 121 of the processor 12 is 0 V or the power source VDD is not connected to the power supply terminal 121 of the processor 12, is the same as the operation in the state in which the power source VDD is turned on and in the state in which the operation mode of the processor 12 is the standby mode, as illustrated in FIG. 5, and the voltage of the internal signal line SL is limited not to be higher than VBE_Q2.

Figure 6C:
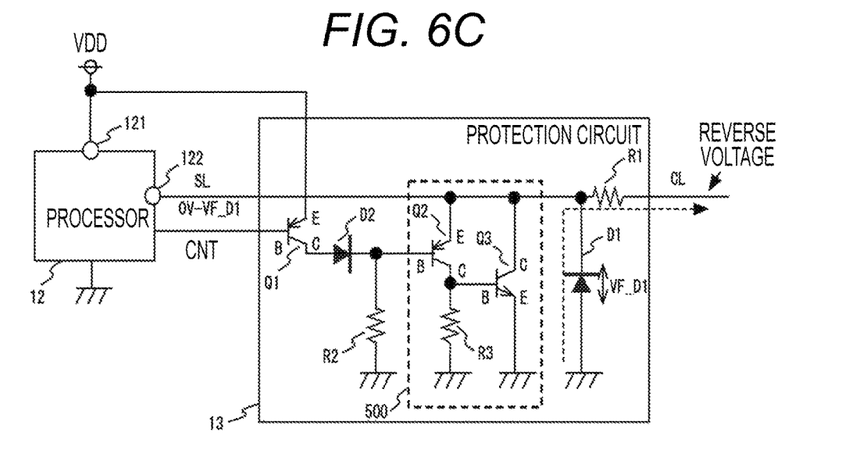

In the protection circuit 13, as illustrated in FIG. 6C, when a voltage lower than the ground GND is applied to the communication line CL, the internal signal line SL is connected to the ground GND via the first diode D1 and the potential of the internal signal line SL is maintained at a potential obtained by subtracting the forward voltage VF_D1 of the first diode D1 from the potential of the ground GND.

While there has been illustrated and described what is at present contemplated to be preferred embodiments of the present invention, it will be understood by those skilled in the art that various changes and modifications may be made, and equivalents may be substituted for elements thereof without departing from the true scope of the invention. In addition, many modifications may be made to adapt a particular situation to the teachings of the invention without departing from the central scope thereof. Therefore, it is intended that this invention not be limited to the particular embodiments disclosed, but that the invention will include all embodiments falling within the scope of the appended claims.

What is claimed is:

1. An overvoltage protection device that protects a device for transmitting or receiving a signal using a signal line from an overvoltage, the overvoltage protection device comprising:
    a first switch of which switching between an ON state and an OFF state is controlled by the device;
    a resistor; and
    a second switch,
    wherein the first switch connects a power supply terminal as a terminal of the device supplied with a source voltage of the device and a first terminal of the resistor in the ON state,
    a second terminal of the resistor is connected to a ground of the device, and
    the second switch is turned on to connect the signal terminal of the device to the ground of the device when a voltage of the signal terminal as a terminal of the device inputting or outputting the signal transmitted using the signal line is higher by a predetermined level than the voltage of the first terminal of the resistor.

2. The overvoltage protection device according to claim 1, wherein the second switch is a Darlington circuit.

3. The overvoltage protection device according to claim 1, wherein the first switch is a PNP transistor of which the base is connected to a control signal output terminal of the device.

4. The overvoltage protection device according to claim 3, wherein the collector of the PNP transistor is connected to the first terminal of the resistor through a diode.

5. An overvoltage protection device that protects a device for transmitting or receiving a signal using a signal line from an overvoltage, the overvoltage protection device comprising:
    a first transistor;
    a second transistor;
    a third transistor;
    a first diode;
    a first resistor; and
    a second resistor,
    wherein the first transistor is a PNP transistor of which an emitter is connected to a power supply terminal as a terminal of the device supplied with a source voltage of the device, a base is connected to a control signal output terminal of the device, and a collector is connected to an anode of the first diode,
    a cathode of the first diode is connected to a first terminal of the first resistor,
    a second terminal of the first resistor is connected to a ground of the device,
    the second transistor is a PNP transistor of which an emitter is connected to a signal terminal as a terminal of the device inputting or outputting the signal transmitted using the signal line, a base is connected to the first terminal of the first resistor, and a collector is connected to the first terminal of the second resistor, a second terminal of the second resistor is connected to the ground of the device, and the third transistor is an NPN transistor of which a collector is connected to the signal terminal of the device, a base is connected to the first terminal of the second resistor, and an emitter is connected to the ground of the device.

6. The overvoltage protection device according to claim 5, wherein a forward voltage of the first diode is equal to a junction saturation voltage (VBE) of the second transistor.

7. The overvoltage protection device according to claim 6, further comprising a second diode of which a cathode is connected to the collector of the third transistor and an anode is connected to the ground of the device.

8. The overvoltage protection device according to claim 7, further comprising a resistor of which a first terminal is connected to the cathode of the second diode and a second terminal is connected to the signal line.

\* \* \* \* \*